United States Patent
Koo et al.

(10) Patent No.: US 8,912,094 B2
(45) Date of Patent: Dec. 16, 2014

(54) METHOD FOR MANUFACTURING STRETCHABLE THIN FILM TRANSISTOR

(71) Applicant: Electronics and Telecommunications Research Institute, Daejeon (KR)

(72) Inventors: Jae Bon Koo, Daejeon (KR); Chan Woo Park, Daejeon (KR); Soon-Won Jung, Daejeon (KR); Sang Chul Lim, Daejeon (KR); Ji-Young Oh, Daejeon (KR); Bock Soon Na, Daejeon (KR); Hye Yong Chu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 39 days.

(21) Appl. No.: 13/846,437

(22) Filed: Mar. 18, 2013

(65) Prior Publication Data
US 2014/0134840 A1    May 15, 2014

(30) Foreign Application Priority Data
Nov. 12, 2012  (KR) .................. 10-2012-0127615

(51) Int. Cl.
*H01L 21/44*    (2006.01)
*H01L 21/768*    (2006.01)

(52) U.S. Cl.
CPC .................. *H01L 21/76838* (2013.01)
USPC ............... 438/666; 438/50; 438/22; 438/98; 438/150; 438/675; 257/99; 257/774; 257/586

(58) Field of Classification Search
CPC . H01L 21/00; H01L 2021/00; H01L 2221/00; H01L 2223/00; H01L 2924/00; H01L 2925/00
USPC .......... 438/50, 22, 98, 666, 675, 150; 257/99, 257/774, E21.586
See application file for complete search history.

(56) References Cited

U.S. PATENT DOCUMENTS

| | | | | |
|---|---|---|---|---|
| 2010/0007942 A1* | 1/2010 | Oikawa et al. | ................ | 359/296 |
| 2010/0315476 A1* | 12/2010 | Sheats | ........................... | 347/204 |
| 2012/0273831 A1* | 11/2012 | Suga | .............................. | 257/99 |

OTHER PUBLICATIONS

Yugang Sun et al., "Controlled buckling of semiconductor nanoribbons for stretchable electronics". Nature Nanotechnology, Dec. 2006, pp. 201-207, vol. 1.
Tsuyoshi Sekitani et al., "A Rubberlike Stretchable Active Matrix Using Elastic Conductors", Science, Sep. 2008, pp. 1468-1472, vol. 321.
Darren S. Gray et al., "High-Conductivity Elastomeric Electronics", Advanced Materials, Mar. 2004, pp. 393-397, vol. 16, No. 5.
Dahl-Young Khang et al., "A Stretchable Form of Single-Crystal Silicon High-Performance Electronics on Rubber Substrates", Science, Jan. 2006, pp. 208-212, vol. 311, No. 208.

* cited by examiner

*Primary Examiner* — Telly Green

(57) ABSTRACT

Provided is a method for manufacturing a stretchable thin film transistor. The method for manufacturing a stretchable thin film transistor includes forming a mold substrate, forming a stretchable insulator on the mold substrate, forming a flat substrate on the stretchable insulator, removing the mold substrate, forming discontinuous and corrugated wires on the stretchable insulator, forming a thin film transistor connected between the wires, and removing the flat substrate.

13 Claims, 6 Drawing Sheets

METHOD FOR MANUFACTURING STRETCHABLE THIN FILM TRANSISTOR

CROSS-REFERENCE TO RELATED APPLICATIONS

This U.S. non-provisional patent application claims priority under 35 U.S.C. §119 of Korean Patent Application No. 10-2012-0127615, filed on Nov. 12, 2012, the entire contents of which are hereby incorporated by reference.

BACKGROUND OF THE INVENTION

The present invention disclosed herein relates to a method for manufacturing a thin film transistor, and more particularly, to a method for manufacturing a stretchable thin film transistor.

Stretchable electronic devices may maintain an electrical function as it is even though a substrate is expended by stress applied from the outside. Stretchable electronic devices may overcome limitations of bendable and/or flexible devices, and thus be applicable in various fields such as sensor skin for robot, wearable communication devices, internal/attachable bio-devices for human body, next generation displays, and the like.

Such a stretchable electronic device may have a structure in which a metal wire is extended. The metal wire is transferred onto a surface of a pre-strained stretchable substrate, and then the stretchable substrate is shrunk to form a metal wire having a wave form. The metal wire may give stretchability to the electronic device. However, the stretchable electronic device may be limited in stretchability of the metal wire by the intensity of pre-strain initially applied into the substrate. Since the metal wire having the wave form has a complicated manufacturing process when compared to that of a general semiconductor device manufacturing process, it is difficult to apply the metal wire into a device having a large area and secure reliability of the metal wire.

Another stretchable electronic device may include a wire formed of a stretchable material having conductivity instead of a metal. The conductive stretchable material includes conductive materials such as conductive polymers, carbon nanotubes, graphene, and the like. However, the conductive stretchable material has high expending capacity, but high electrical resistance than metals. Thus, it is difficult to form a fine micrometer-sized pattern on the conductive stretchable material.

Further another stretchable electronic device may include a wire having a two-dimensional plane spring shape. The spring-shaped wire is compatible with a general semiconductor device process to reduce manufacturing costs and easily secure reliability, thereby having high conductivity. However, when the spring-shaped wire is expanded, since the deformation of the wire may be locally concentrated into a specific portion of the wire to cause damage of the wire, there is limitation in increasing an extending rate.

SUMMARY OF THE INVENTION

The inventive concept provides a method for manufacturing a stretchable thin film transistor which is capable of easily forming corrugated wires.

The inventive concept also provides a method for manufacturing a stretchable thin film transistor which is capable of improving productivity.

Embodiments of the inventive concept provide methods for manufacturing of stretchable thin film transistor, the method including: forming a mold substrate; forming a stretchable insulator on the mold substrate; forming a flat substrate on the stretchable insulator; removing the mold substrate; forming discontinuous and corrugated wires on the stretchable insulator; forming a thin film transistor connected between the wires; and removing the flat substrate.

In some embodiments, the mold substrate may include a bottom substrate and photoresist patterns on the bottom substrate. The bottom substrate may contact a device area on the stretchable insulator, and the photoresist patterns contact a wire area on the stretchable insulator.

In still other embodiments, the device area of the stretchable insulator may be thicker than that of the wire area.

In even other embodiments, the forming of the wires may further include: forming the discontinuous wires on the stretchable insulator; thermally treating the wires and the stretchable insulator; and quenching the wires and the stretchable insulator. The thermally treating of the wires and the stretchable insulator may be performed at a temperature of about 100° C. to about 300° C.

In further embodiments, the method may further include forming an interconnection wire connecting the thin film transistor to the wires. The interconnection wire may be formed by using a printing method.

In even further embodiments, the stretchable insulator may include poly-dimethyllesiloxane (PDMS).

In other embodiments of the present invention, methods for manufacturing a stretchable thin film transistor include: forming a stretchable insulator on a substrate; forming discontinuous and corrugated wires on the stretchable insulator; forming a thin film transistor connected to the wires; and removing the substrate.

In some embodiments, the forming of the wires may include: forming the discontinuous wires on the stretchable insulator; thermally treating the wires or the stretchable insulator; and quenching the stretchable insulator and the wires.

In other embodiments, the method may further include forming an interconnection wire connecting the thin film transistor to the wires. The interconnection wire may be formed by using a printing method.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

It should be construed that foregoing general illustrations and following detailed descriptions are exemplified and an additional explanation of claimed inventions is provided. The inventive concept may, however, be embodied in different forms and should not be construed as limited to the embodiments set forth herein. Rather, these embodiments are provided so that this disclosure will be thorough and complete, and will fully convey the scope of the present invention to those skilled in the art.

In the description, when it is described that a certain part includes certain elements, the part may further include other elements. Further, the embodiments exemplified and described herein include complementary embodiments thereof. Hereinafter, the embodiments of the present invention will be described in detail with reference to the accompanying drawings.

FIGS. 1 to 9 are cross-sectional views sequentially illustrating a process for manufacturing a stretchable thin film transistor according to an embodiment of the inventive concept.

Figure 1:
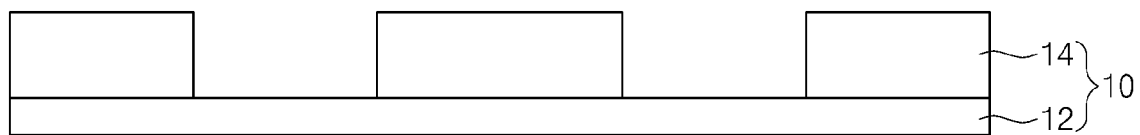
FIGS. 1 to 9 are cross-sectional views sequentially illustrating a process for manufacturing a stretchable thin film transistor according to an embodiment of the inventive concept.

Referring to FIG. 1, photoresist patterns 14 are formed on a bottom substrate 12. The bottom substrate 12 and the photoresist patterns 14 may be a mold substrate 10. The bottom substrate 12 may include a glass or wafer. The photoresist patterns 14 are formed by using a photolithography process.

Figure 2:
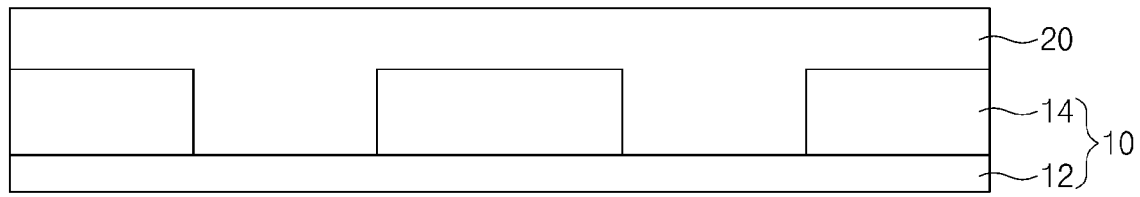

Referring to FIG. 2, a stretchable insulator 20 is formed on the mold substrate 10. The stretchable insulator 20 may include elastomers such as poly-dimethyllesiloxane (PDMS) or polyurethane. The mold substrate 10 may form a device area 22 and a wire area 24 of the stretchable insulator 20. The device area 22 and the wire area 24 of the stretchable insulator 20 may have different thicknesses. The device area 22 may be thicker than the wire area 24. The wire area 24 may contact the photoresist patterns 14, and the device area 22 may contact the bottom substrate 12.

Figure 3:
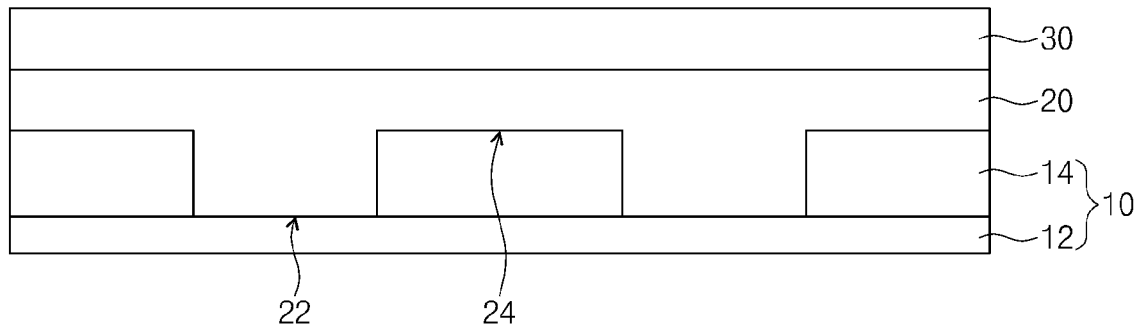

Referring to FIG. 3, a flat substrate 30 is bonded on the stretchable insulator 20. The flat substrate 30 may include a glass or wafer. The stretchable insulator 20 and the flat substrate 30 are bonded to each other without an adhesive.

Figure 4:
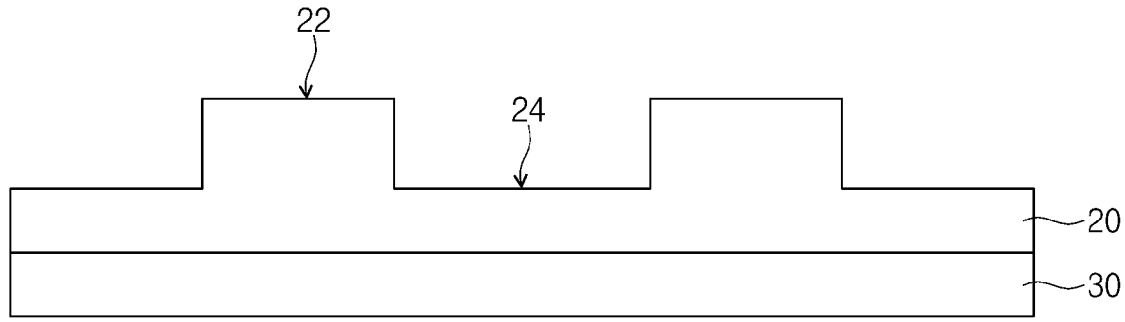

Referring to FIG. 4, the mold substrate 10 is removed. The photoresist patterns 14 of the mold substrate 10 are removed by an organic solvent such alcohol. The bottom substrate 12 is delaminated from the stretchable insulator 20 by an external force.

Figure 5:
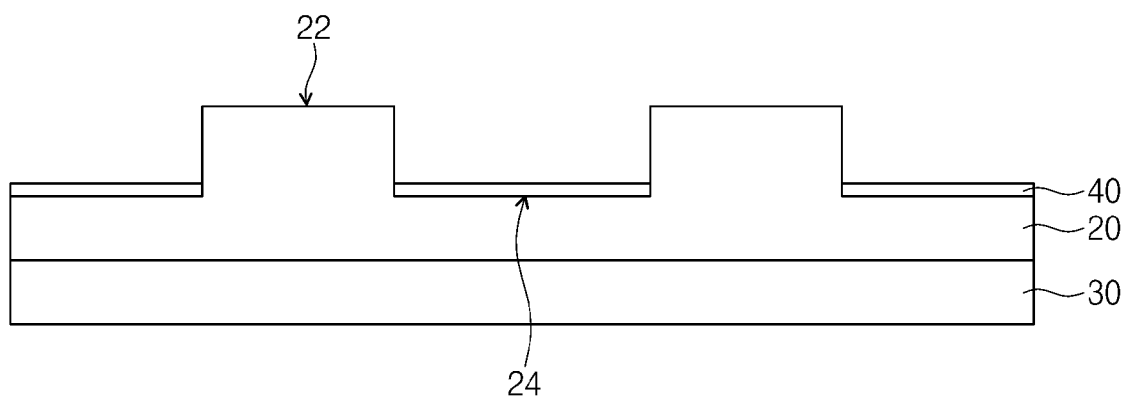

Referring to FIG. 5, discontinuous wires 40 are formed on the stretchable insulator 20. The wires 40 may be formed through a metal film deposition process, a photolithography process, and an etching process. The metal thin film may include nickel (Ni), aluminum (Al), copper (Cu), chromium (Cr), molybdenum (Mo), gold (Au), or silver (Ag).

Figure 6:
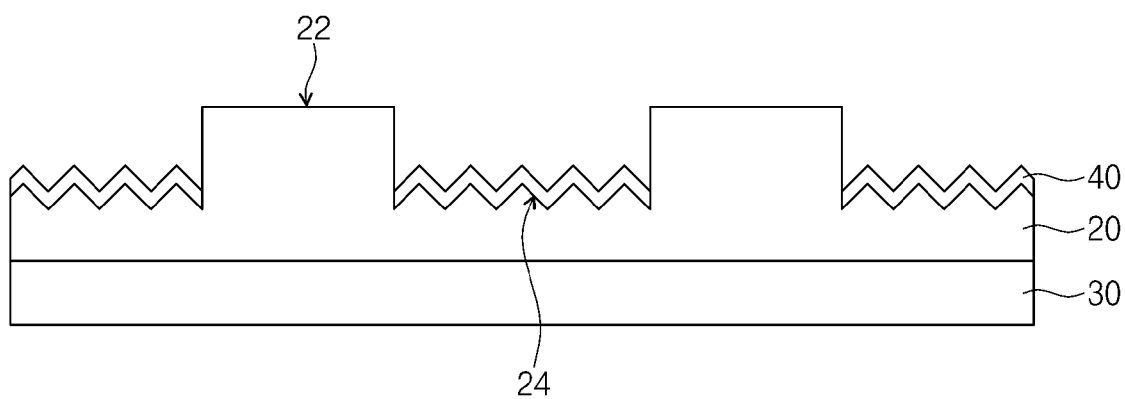

Referring to FIG. 6, the wires 40 and the stretchable insulator 20 are heated and then quenched to form corrugated wires 40. The wires 40 and stretchable insulator 20 may be heated at a temperature of about 100° C. to about 300° C. When the wires 40 and stretchable insulator 20 are quenched, corrugation may be formed on the wires 40 and stretchable insulator 20 by a thermal expansion coefficient difference therebetween. The corrugation of the wires is controlled by a heat treatment temperature and quenching time. The PDMS has a thermal expansion coefficient greater by about 20 times or more than that of the metal. The wires 40 may be corrugated on the stretchable insulator 20 without separate additional treatment process expect for the heat treatment process. Thus, the method for manufacturing the stretchable thin film transistor according to an embodiment of the inventive concept may improve the productivity.

Figure 7:
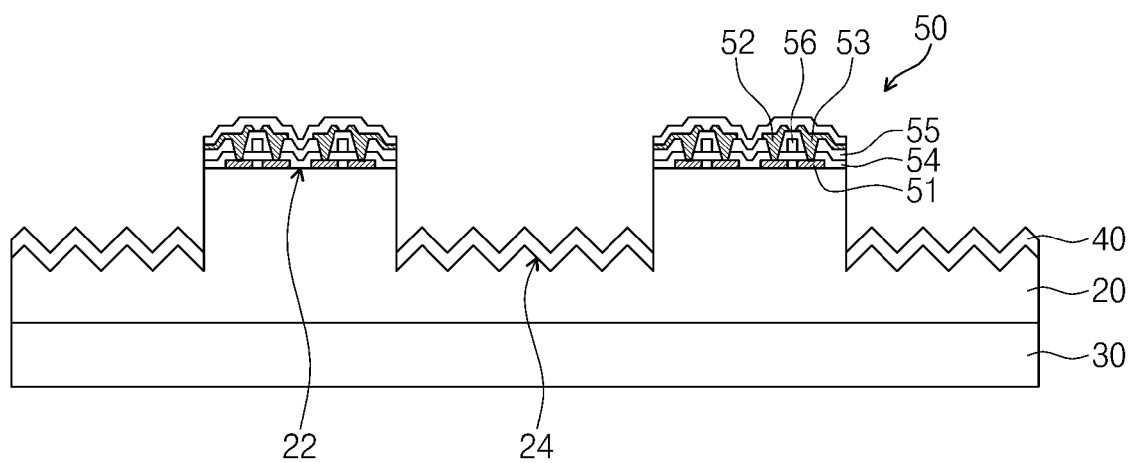

Referring to FIG. 7, thin film transistors 50 are formed between the wires 40. The thin film transistors 50 may be formed on the device area 22. The thin film transistors 50 may be formed through a plurality of deposition, photolithography, and etching processes. The thin film transistors 50 may include an active layer 51, source/drain electrodes 52 and 53, a gate insulation layer 54, a gate upper insulation layer 55, and a metal gate electrode 56. The active layer 51 may include polysilicon. The gate insulation layer 54 may include a dielectric of a silicon oxide layer. The polysilicon and dielectric are formed through a deposition process such as a chemical vapor deposition method. The polysilicon may be patterned using the photolithography process and the etching process. The source/drain electrodes 52 and 53 and the gate electrode 56 may include a transparent metal such indium-tin oxide (ITO). The metal may be formed by using a deposition process such as a sputtering method. Also, the metal may be patterned using the photolithography process and the etching process.

Figure 8:
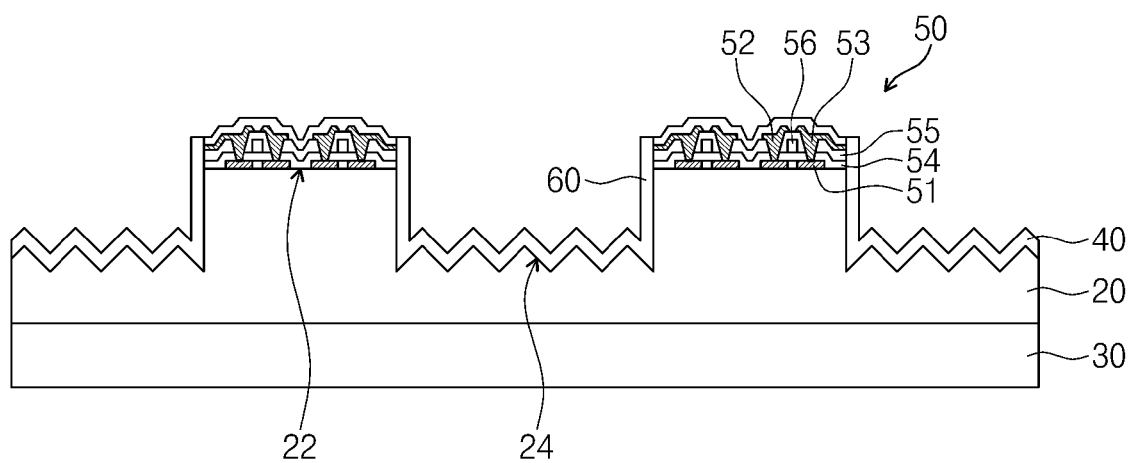

Referring to FIG. 8, interconnection wires 60 are formed to connect the wires 40 to the thin film transistors 50. The interconnection wires 60 may be formed between the device area 22 and the wire area 24. The interconnection wires 60 may be formed using an ink-jet printing method.

Figure 9:
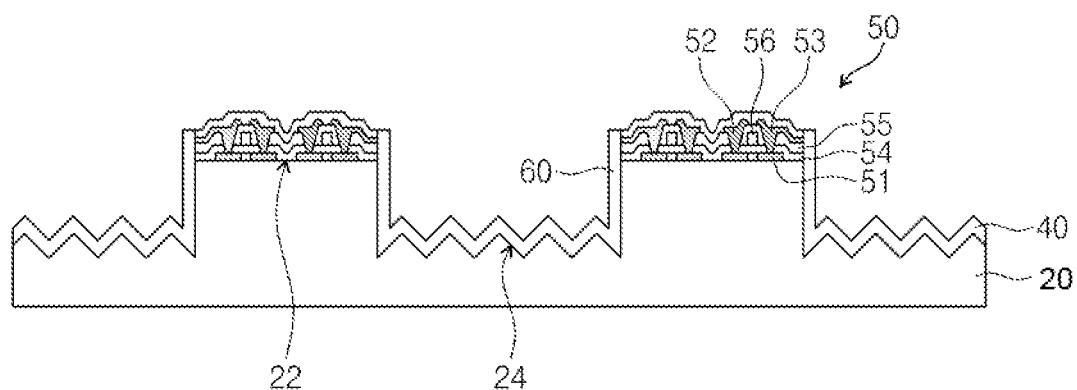

Referring to FIG. 9, a flat substrate 30 is removed. The flat substrate 30 may be etched by using an etchant. The flat substrate 30 is delaminated from the stretchable insulator 20 by an external force.

FIGS. 10 to 15 are cross-sectional views sequentially illustrating a process for manufacturing a stretchable thin film transistor according to another embodiment of the inventive concept.

Figure 10:
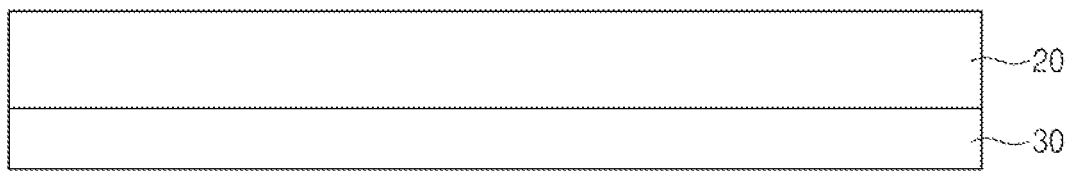
FIGS. 10 to 15 are cross-sectional views sequentially illustrating a process for manufacturing a stretchable thin film transistor according to another embodiment of the inventive concept.

Referring to FIG. 10, a stretchable insulator 20 is formed on a flat substrate 30. The stretchable insulator 20 may be applied onto the flat substrate 30. The stretchable insulator 20 may include an elastomer such as PDMS or polyurethane.

Figure 11:
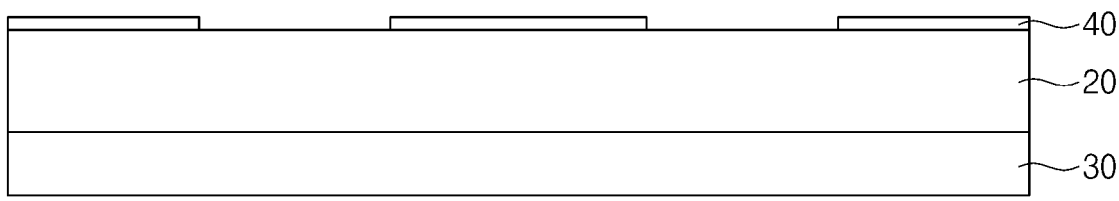

Referring to FIG. 11, discontinuous wires 40 are formed on the stretchable insulator 20. The wires 40 may be formed through a metal film deposition process, a photolithography process, and an etching process.

Figure 12:
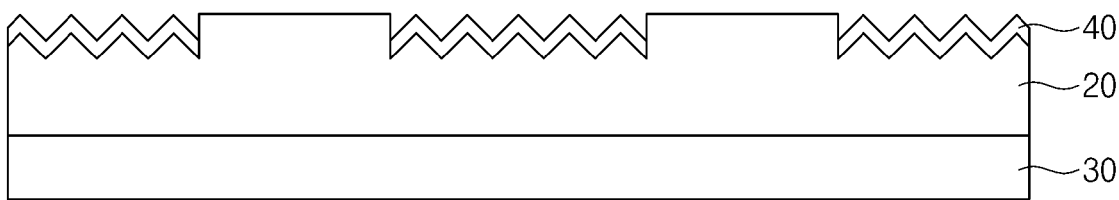

Referring to FIG. 12, the wires 40 and the stretchable insulator 20 are heated and then quenched to form corrugated wires 40. The wires 40 and stretchable insulator 20 may be heated at a temperature of about 100° C. to about 300° C. When the wires 40 and stretchable insulator 20 are quenched, corrugation may be formed on the wires 40 and the stretchable insulator 20 by a thermal expansion coefficient difference therebetween. The PDMS has a thermal expansion coefficient greater by about 20 times or more than that of the metal. The wires 40 may be corrugated on the stretchable insulator 20 without separate additional treatment process expect for the heat treatment process. The stretchable insulator 20 may have a roughness on a contact surface with the wires 40. The stretchable insulator 20 exposed from the wires 40 may have a flat surface.

Thus, the method for manufacturing the stretchable thin film transistor according to another embodiment of the inventive concept may improve the productivity.

Figure 13:
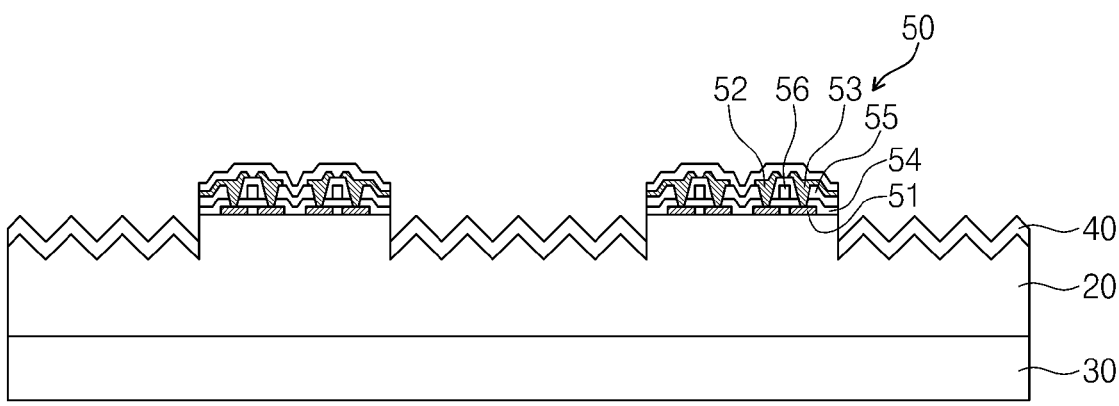

Referring to FIG. 13, thin film transistors 50 are formed on the stretchable insulator 20 between the wires 40. As described above, the thin film transistors 50 may be formed through a plurality of deposition, photolithography, and etching processes. The thin film transistors 50 may include an active layer 51, source/drain electrodes 52 and 53, a gate insulation layer 54, a gate upper insulation layer 55, and a metal gate electrode 56.

Figure 14:
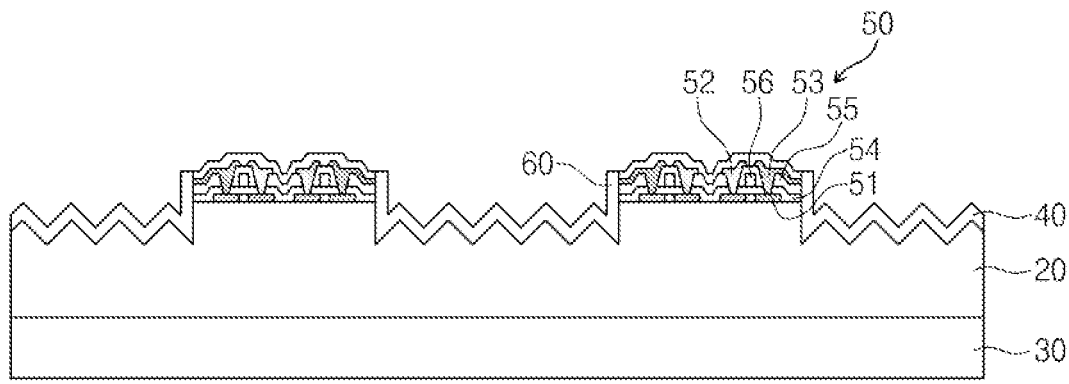

Referring to FIG. 14, interconnection wires 60 are formed to connect the thin film transistors 50 to the wires 40. The interconnection wires 60 may be formed using the ink jet-printing method.

Figure 15:
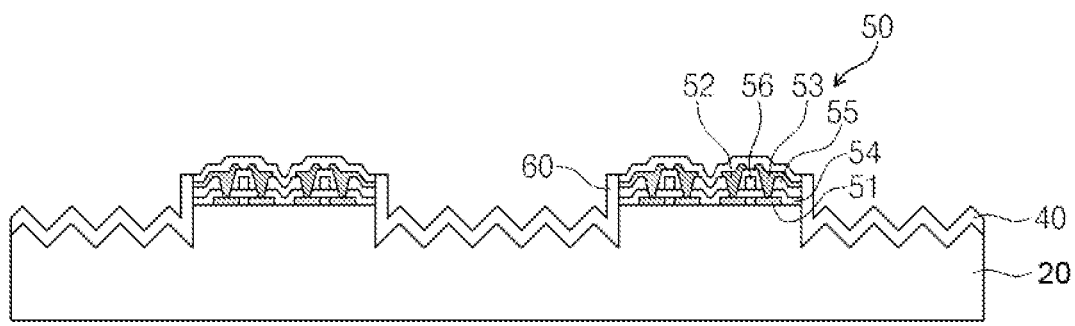

Referring to FIG. 15, the flat substrate 30 is moved. The flat substrate 30 may be etched by using an etchant or delaminated from the stretchable insulator 20 by an external force.

The method for manufacturing the stretchable thin film transistor according to the embodiments of the present invention provides the stretchable insulator having the device area thicker than the wire area. The discontinuous wires may be formed on the wire area. Then, the wires and the stretchable insulator are heated and quenched to form the corrugated wires. The corrugation of the wires is controlled by the heat treatment temperature and quenching time. The wires may be corrugated without the separate additional process except for the heat treatment and quenching. The thin film transistor may be formed on the device area, and the interconnection wire may be formed between the thin film transistor and the wires. Thus, the method for manufacturing the stretchable thin film transistor according to the embodiments of the present invention may improve the productivity.

Until now, preferred embodiments of the present invention are described mainly. It will be understood by those skilled in the art that various changes in form and details may be made therein without departing from the spirit and scope of the invention as defined by the appended claims. Therefore, the preferred embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. A method for manufacturing a stretchable thin film transistor, the method comprising:
    forming a mold substrate;
    forming a stretchable insulator on the mold substrate;
    forming a flat substrate on the stretchable insulator;
    removing the mold substrate;
    forming corrugated wires on the stretchable insulator;
    forming a thin film transistor connected between the corrugated wires; and
    removing the flat substrate,
    wherein forming the corrugated wires comprises:
        forming discontinuous wires on the stretchable insulator;
        thermally expanding the discontinuous wires and the stretchable insulator, a thermal expansion coefficient of the stretchable insulator being greater than a thermal expansion coefficient of the discontinuous wires; and
        quenching the thermally expanded wires and the thermally expanded discontinuous stretchable insulator to form the corrugated wires.

2. The method of claim 1, wherein the mold substrate comprises a bottom substrate and photoresist patterns on the bottom substrate.

3. The method of claim 2, wherein the bottom substrate contacts a device area on the stretchable insulator, and
    the photoresist patterns contact a wire area on the stretchable insulator.

4. The method of claim 3, wherein the device area of the stretchable insulator is thicker than that of the wire area.

5. The method of claim 1, wherein thermally expanding the discontinuous wires and the stretchable insulator is performed at a temperature in a range of about 100° C. to about 300° C.

6. The method of claim 1, further comprising forming an interconnection wire connecting the thin film transistor to the corrugated wires.

7. The method of claim 6, wherein the interconnection wire is formed by using a printing method.

8. The method of claim 1, wherein the stretchable insulator comprises poly-dimethyllesiloxane (PDMS).

9. A method for manufacturing a stretchable thin film transistor, the method comprising:
    forming a stretchable insulator on a substrate;
    forming corrugated wires on the stretchable insulator;
    forming a thin film transistor connected to the corrugated wires; and
    removing the substrate,
    wherein forming the corrugated wires comprises:
        forming discontinuous wires on the stretchable insulator;
        thermally expanding the discontinuous wires and the stretchable insulator, a thermal expansion coefficient of the stretchable insulator being greater than a thermal expansion coefficient of the discontinuous wires; and
        quenching the thermally expanded wires and the thermally expanded discontinuous stretchable insulator to form the corrugated wires.

10. The method of claim 9, further comprises forming an interconnection wire connecting the thin film transistor to the corrugated wires.

11. The method of claim 10, wherein the interconnection wire is formed by using a printing method.

12. The method of claim 1, wherein the thermal expansion coefficient of the stretchable insulator is equal to or greater than 20 times of the thermal expansion coefficient of the discontinuous wires.

13. The method of claim 9, wherein the thermal expansion coefficient of the stretchable insulator is equal to or greater than 20 times of the thermal expansion coefficient of the discontinuous wires.

* * * * *